United States Patent
Ando et al.

(10) Patent No.: US 6,383,346 B2
(45) Date of Patent: *May 7, 2002

(54) METHOD FOR FORMING THIN FILMS

(75) Inventors: Kenji Ando, Kawasaki; Masaaki Matsushima, Yokohama; Minoru Otani, Tokyo; Yasuyuki Suzuki, Yokohama; Ryuji Biro, Kawasaki; Hidehiro Kanazawa, Tokyo, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/821,435

(22) Filed: Mar. 21, 1997

(30) Foreign Application Priority Data

Mar. 22, 1996 (JP) .............................................. 8-093535
Mar. 19, 1997 (JP) .............................................. 9-086123

(51) Int. Cl.[7] .............................................. C23C 14/34
(52) U.S. Cl. ........................... 204/192.26; 204/192.13; 204/192.15; 204/192.22; 204/192.27; 204/192.28
(58) Field of Search ....................... 204/192.13, 192.15, 204/192.22, 192.26, 192.27, 192.28, 192.29

(56) References Cited

U.S. PATENT DOCUMENTS

| 3,477,936 A | * 11/1969 | Gillery et al. | .......... 204/192.29 |
| 4,125,446 A | 11/1978 | Hartsough | .............. 204/192 P |
| 4,407,709 A | * 10/1983 | Enjouji et al. | .......... 204/192.13 |
| 4,849,081 A | * 7/1989 | Ross | ..................... 204/192.26 |
| 5,427,669 A | * 6/1995 | Drummond | ............ 204/298.08 |

FOREIGN PATENT DOCUMENTS

| JP | 770749 | 3/1995 | ............ C23C/14/34 |
| JP | 7258841 | 10/1995 | ............ C23C/14/34 |
| JP | 7258845 | 10/1995 | ............ C23C/14/44 |
| WO | 92/17620 | * 10/1992 | |

OTHER PUBLICATIONS

Harding, "High Rate D.C. Reactively Sputtered Metal–Oxy–Fluorine Dielectric Materials", Thin Solid Films, 138 pp. 279–287, 1986.*

* cited by examiner

Primary Examiner—Rodney G. McDonald
(74) Attorney, Agent, or Firm—Fitzpatrick, Cella, Harper & Scinto

(57) ABSTRACT

The present invention provides a method for forming a film of aluminum oxide in which a target containing aluminum is sputtered in a gas containing fluorine atoms.

The thin film of aluminum oxide according to the present invention has little optical absorption and high refractive index in the ultraviolet and vacuum ultraviolet regions.

15 Claims, 5 Drawing Sheets

METHOD FOR FORMING THIN FILMS

BACKGROUND OF THE INVENTION

1. Field of the Invention

This invention relates to a method for forming thin films that are used for optical parts, as a reflection preventing film or reflection enhancing film, and especially to a method for forming thin films suitable for use in optical parts applicable in ultraviolet and vacuum ultraviolet regions because they have a good spectroscopic characteristics in the ultraviolet region (wavelength of 230 to 400 nm) and vacuum ultraviolet region (wavelength of 190 to 230 nm).

2. Related Background Art

Methods for forming thin films by sputtering are widely used in the conventional art because they are rather easily used for forming thin film of metals, insulators and various kind of compounds. There are a variety of sputtering methods such as magnetron sputtering and facing sputtering.

The magnetron sputtering, known as a sputtering method capable of a high speed deposition, electrons are confined by magnetic field to increase plasma density.

A method for forming a film of indium-tin mixed oxide (ITO) by sputtering in a gas containing fluorine together with hydrogen and water is disclosed in Japanese Patent Publication No. 6-506266/International Publication WO 92/17620.

In U.S. Pat. No. 4,125,446, a method for forming a metallic film of aluminum by sputtering in a gas containing water and Ar is disclosed.

In a sputtering process for forming oxide films like alumina ($Al_2O_3$), alumina or aluminum (Al) is used as a target material and thin films are formed by a sputtering or reactive sputtering in a mixed gas of argon (Ar) and oxygen ($O_2$). In the methods for forming thin films by sputtering or reactive sputtering, a target material is ejected by ions accelerated under an ion-sheath voltage.

When the target material is composed of a compound, for example an alumina ($Al_2O_3$) target, the sputtering particles of alumina ejected from the target by an ion impact are decomposed and ejected from the target. The sputtering particles ejected are oxidized by colliding with oxygen or the like, in the plasma or on the surface of substrates.

The method for forming a thin film of aluminum oxide is disclosed in Japanese Patent Application Laid-Open No. 7-70749.

An example of a film-forming apparatus is a sputtering system (an apparatus for forming sputtering thin films) in which an ion source is mounted to enhance reactivity by an ion-assist effect, by irradiating the ions to the substrate.

A sputtering system and method for forming sputtering films are proposed in Japanese Patent Application Laid-Open Nos. 7-258841 and 7-258845, wherein a positive voltage is applied on a target electrode to prevent abnormal electric discharge during sputtering. It was proved that a SiOF film having a lower dielectric constant than that of conventional silicon oxide ($SiO_2$) films is formed when a mixed material of oxides with fluorides is used. For example, it was reported that SiOF films containing F atoms were formed by a plasma chemical vapor deposition (CVD) method by adding a mixed gas containing fluorine.

However, the alumina thin film formed by this method contains unreacted bonds (dangling bonds) that are bond deficiencies, thereby forming a film containing fewer oxygen atoms than required satisfy a stoichiometric oxygen content.

Recently, a so-called eximer stepper, using an eximer laser that emits vacuum ultraviolet light having a short wavelength range (190 to 230 nm), is used for a light source for a projection aligner for producing semiconductor devices to attain a high resolution.

The thin films of alumina ($Al_2O_3$) formed by the conventional method for forming thin sputtering films and the system for forming the same described above, has a rather large absorption in the ultraviolet wavelength region and, especially, in the vacuum ultraviolet wavelength region. Therefore, it is difficult to use these thin films as optical thin films for ArF eximer steppers.

Twenty to thirty pieces of lenses are usually combined in the projection optical system for producing semiconductor devices. It is important to form several to dozens of multi-film layers of dielectric materials, as reflection preventing layers, having different refractive indices with each other on the surface of each lens to reduce the reflection index of the lens.

Suppose that 30 pieces of lenses are used in the projection optical system and the absorption of the reflection preventing film on each lens is 1% in the working wavelength region of ultraviolet and vacuum ultraviolet light. Then, the intensity of the transmitted light is reduced to 54.7% (the 60th power of 0.99) of the incident beam since the light transmittance decays in proportion to n-th power (n is the numbers of the lens used) of transmittance. Moreover, when the reflection preventing film has some degree of light absorption, the absorbed light energy is transferred into heat energy, which affects the quality of the printed images due to distortion of the lens. The reflection preventing film at the site where the eximer laser beam focuses may be broken.

SUMMARY OF THE INVENTION

An object of the present invention is to provide an optical thin film with little optical absorption and a good spectroscopic characteristics in the ultraviolet region and in the vacuum ultraviolet region.

An another object of the present invention is to provide an optical thin film comprising aluminum oxide containing fluorine.

Still another object of the present invention is to provide an optical film comprising aluminum oxide having the ratio of the number of the atoms other than aluminum to the number of aluminum atoms is larger than 1.55 and smaller than 1.85.

Still further object of the present invention is to provide an optical thin film comprising aluminum oxide prepared by sputtering a target containing aluminum in a gas comprising fluorine atoms in which, if required, oxygen, water and helium are added.

DETAILED DESCRIPTION OF THE PREFERRED EMBODIMENT

Figure 1:
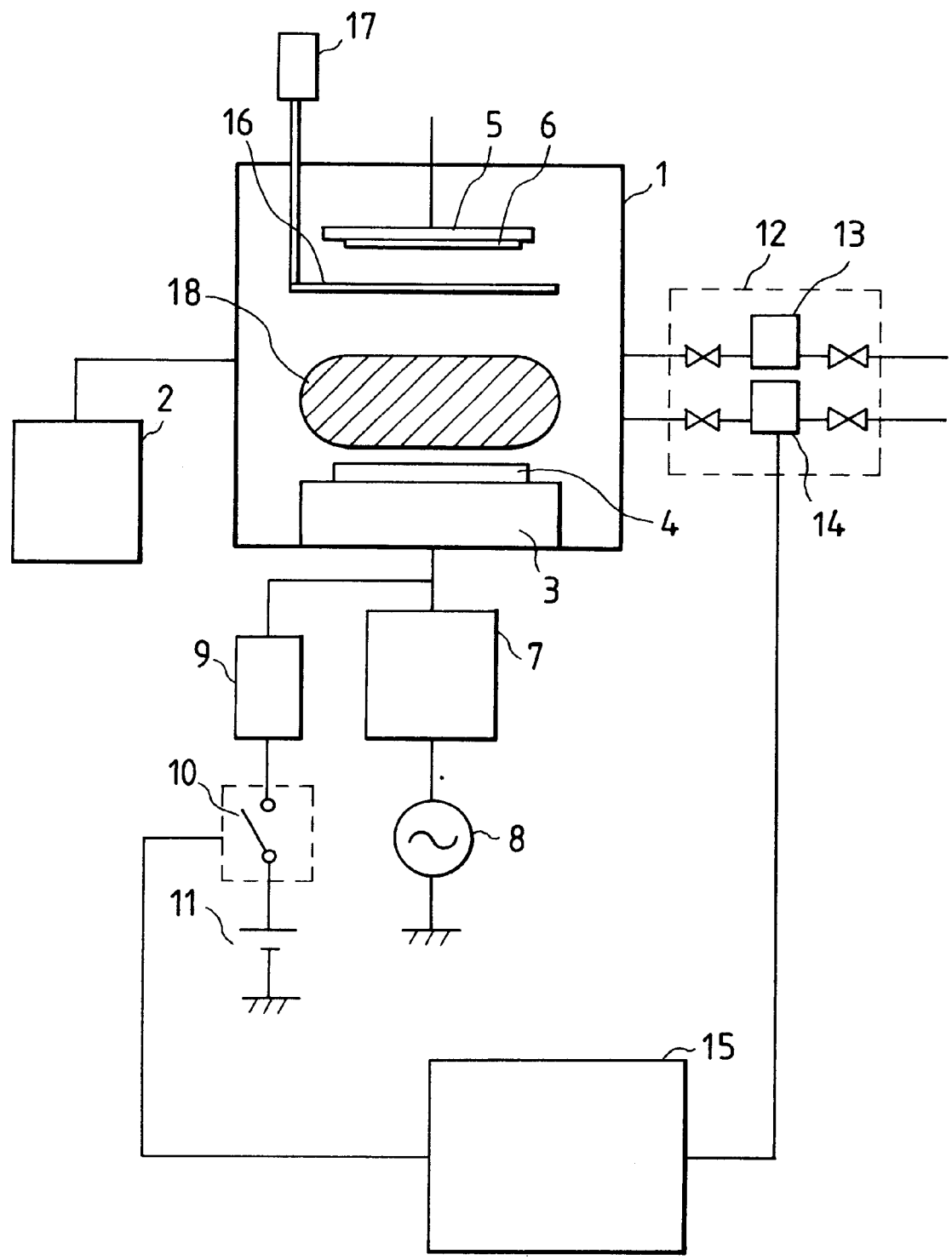
FIG. 1 is a schematic illustration of the system for forming thin films according to the present invention.

FIG. 1 is a schematic illustration of the main components of the system for forming sputtering thin films according to the present invention. In the figure, numeral 1 is a vacuum vessel as a reaction chamber. Mounted in the vacuum vessel 1 are an evacuation means 2 for evacuating the air in the vessel, a gas feed means 12 for introducing various gases into the vessel, and a shutter driving system 17 for driving a shutter plate 16 equipped in the vessel. A cathode electrode 3 and a substrate holder 5 for holding a substrate 6 at a position opposed to the cathode electrode 3 are disposed in the vacuum vessel 1. An aluminum target 4 that serves as a target material is attached to the cathode electrode 3. The substrate holder 5 has a device for heating the substrate 6 attached to it. The shutter plate 16 is disposed at the foot of the substrate 6 to control the timing for forming thin films (thin films of alumina) on the substrate 6.

A high frequency power source 8 is connected to the cathode electrode 3 via a matching box 7 for matching discharge impedance. One terminal of a switch 10 is connected to the cathode electrode 3 via a low pass filter 9 for cutting high frequency components off from the high frequency power source 8. The other terminal of the switch 10 is connected to a DC power source 11 for applying DC voltage equal to the self-bias potential of plasma.

Sputtering gases, oxygen ($O_2$) and $NF_3$ gas containing fluorine, are piped to the gas feed means 12 via mass flow controllers (MFC) 13 and 14 for adjusting gas supply. The mass flow controller 14 is provided for adjusting the supply of $NF_3$ gas containing fluorine, while a control system 15 is also provided for controlling the switch 10.

In the present embodiment, 200 sccm of oxygen gas ($O_2$) is introduced into the vacuum vessel 1 via the mass flow controller 13 in the gas inlet means 12 after sufficiently evacuating the air inside of the vacuum vessel 1 by the evacuation means 2. Argon gas may be incorporated in the oxygen gas. A plasma 18 is generated by supplying a high frequency electric power to the cathode electrode 3 and Al target 4 from the high frequency power source 8 via the matching box 7. The high frequency electric power is supplied up to a prescribed level while adjusting the matching so that the intensity of reflected high frequency wave will be kept to its minimum value. After completing a pre-sputtering step for cleaning the surface of the target 4 and for stabilizing discharge, the shutter plate 16 is turned open by the driving force of the shutter driving system 17 to start forming thin films on the substrate 5.

The elements 9, 10, 11 and 15 described above form a means for temporarily keeping the repeating self-bias near the earth potential while the target material is subjected to a sputtering discharge at metal materials (Al).

In the system for forming sputtering thin films according to the present embodiment, means for adding fluorine or gases of fluoride compounds are used when sputtering thin films are formed. Fluorine atoms, fluoride ions and fluoride radicals are formed through a complex decomposition reaction of fluorine or fluoride compounds added during the plasma discharge. The monovalent fluorine atoms, fluoride ions and fluorine radicals formed are so reactive that they are liable to be involved in bond terminations by reacting with the unreacted bonds (dangling bonds) in the thin film formed by sputtering.

When the self-bias during sputtering is temporarily adjusted to the potential near the ground potential, sputtering is suppressed, though the plasma is continuing, and few thin films are formed because ion acceleration to the surface of the target diminishes. When gasses supplemented with fluorine or fluoride compounds are introduced by synchronizing with adjusting the self-bias close to the ground potential, they are decomposed in the plasma and fluorine atoms, fluoride ions and fluoride radicals formed react with unreacted bonds (dangling bonds) on the surface of the substrates, thereby terminating the chemical bonds.

By alternately repeating the steps for film formations and for reactions on the surface of the substrate, the density of the bond deficiencies in the films formed can be decreased.

An excellent optical thin film having low absorption in ultraviolet and vacuum ultraviolet regions and being durable to irradiation of ultraviolet or vacuum ultraviolet laser is obtained by the process described above.

Figure 2:
FIG. 2 is a chart for describing the operation of the apparatus illustrated in FIG. 1.

FIG. 2 is a time chart describing various operations in forming a thin film of alumina on the substrate 5 according to the present embodiment. The figure contains a time chart representing a high frequency voltage having an amplitude of Vrf that is applied at the beginning of electric discharge, at a pre-sputtering stage and at an initial stage of thin film formation, a control signal for the switch 10, and a gas supply ($O_2$ and $NF_3$ gases) configuration from the gas feed means. When a high frequency voltage having an amplitude of Vrf is applied to the target 4 before the electric discharge starts, electrons with a small mass follow along with the electric field and generates a plasma by colliding with gaseous molecules having heavy masses. Electrons are accumulated on the surface of the target 4 due to a difference in mobility between electrons and ions, which imparts negative bias (Vb) to the target.

After the pre-sputtering step has completed, formation of thin films on the substrate 5 starts by opening the shutter plate 16. After starting to form thin films, a control signal is applied from the control system 15 for 5 sec. to the switch 10 and the mass flow controller 14 for adjusting $NF_3$ gas feed. The switch 10 is closed for 5 sec. by the control signal applied to the mass flow controller 14, thereby supplying fluoride gas. A DC voltage is supplied from the DC power source 11. The prescribed output level of this DC voltage is adjusted to an approximately equal level with the self-bias voltage, but its polarity is reversed. Electrons accumulated on the surface of the target 4 flow through the cathode electrode 3, low-pass filter 9 and switch 10 to the DC power source 11 and the bias potential is made to the level close to the ground potential. The plasma still continues because the high frequency voltage is being impressed on the target 4.

$NF_3$ gas with a prescribed flow rate is supplied in the vacuum vessel 1 for 5 sec. when a control signal synchronized with the signal from the switch 10 is supplied to the mass flow controller 14 for adjusting the supply of $NF_3$ gas. The $NF_3$ gas supplied is decomposed into highly reactive monovalent fluorine atoms, fluorine radicals and fluoride ions in the plasma 18, which react with the unreacted bonds of the bond deficiencies in the thin films of alumina formed on the substrate 5. While nitrogen atoms and nitrogen radicals are also formed in the plasma 18, their reactivities are so low compared with oxygenation or fluorination reactions that a nitrogenation reaction with the thin films of alumina formed on the substrate 5 does not start.

An excellent thin film with few bond deficiencies can be formed by alternately repeating the steps mainly for film formation and mainly for reactions.

The signal cycle of the control signals from the control system 15 has a close relation with the film-forming rate. A signal cycle of 0.1 Hz or less is preferable. Since the film-forming rate of the $Al_2O_3$ thin film is 0.03 nm/sec when 2.5 kw of high frequency power is supplied to the Al target 4 with an area of 5×15 square inches while the size of the alumina molecule is several tens of nm, the reaction process was set to start after forming a single layer in this preferred embodiment.

Because the fluorine series of gases with high reactivities are introduced in the film formation according to the present embodiment, it is preferable to use aluminum (Al) materials, which are resistive to fluorine and do not cause any problems when the materials migrate into the film as contaminants, for the vacuum vessel 1 and for the components in the vacuum vessel 1.

The mass flow controller 14 for adjusting the supply of $NF_3$ gas from the gas feed means 12 should be disposed as close as possible to the vacuum vessel 1 to minimize the delay time for introducing the gas. It is also preferable that signals are applied from the control system 15 to the mass flow controller 14 by taking the delay time for introducing the gas into account.

Although $NF_3$ gas was used as a gas containing fluoride compounds, $F_2$, $SiF_4$, $CF_4$, $C_2F_2$ or $C_4F_8$ may be used instead of $NF_3$ gas. These gases were selected from those satisfying the conditions below.

(1-a) The gases should contain fluorine or fluoride compounds because the unreacted chemical bonds (dangling bonds) are terminated by bonding with fluorine atoms.

(1-b) In the case of gases of fluoride compounds, the absorption edge of the compounds formed by oxidizing the atoms bonded to fluorine atom should be in the vacuum ultraviolet region.

(1-c) In the case of gases of fluoride compounds, the atoms bonding to fluorine atom should have low reactivities than oxidation reactions or fluorination reactions.

In the process for forming sputtering thin films described above, the amount of fluorine or gases of fluoride compounds added is preferably from 0.5% to 20% of the amount of the sputtering gas. When the amount is 0.5% or more, the gas exhibits a termination effect that allows the gas to react with the unreacted chemical bonds (dangling bonds) in the thin film formed, thereby making it possible to obtain a film without any optical absorption in the wavelength range from the ultraviolet region having a wavelength of 300 nm or below to the vacuum ultraviolet region having a wavelength of 193 nm.

When the amount of fluorine or gases of fluoride compounds added is more than 20%, some troubles as described below are seen in the process for forming thin films of alumina.

(2-a) When the film-forming rate of aluminum fluoride ($AlF_3$) is very rapid and the amount of the gases added is large during pulse-wise introduction of the reaction gases, a large amount of aluminum fluoride ($AlF_3$) is formed in the sputtering thin film of alumina by the effect of residual fluorine. Aluminum fluoride ($AlF_3$) has an inherent deliquescence that allows the material to be dissolved out by absorbing moisture in the air, thereby causing environmental problems as well as deteriorating durability.

(2-b) Both of the materials having high refractive indices and low refractive indices are required for preparing a film having such optical characteristics as reflection preventing films in the regions from the ultraviolet wavelength of 300 nm or below to the vacuum ultraviolet wavelength of 193 nm. However, any optical materials having high refractive indices suitable for use in the wavelength region described above are not available today. Therefore, the required optical characteristics are only attained by using alumina ($Al_2O_3$) that is an intermediate refraction material having a refractive index of n=1.85 at 193 nm. For example, a material with excellent optical characteristics suitable for forming a reflection preventing film in a broad wavelength range can be obtained by a combination of the materials having a large difference between an intermediate refractive index and a low refractive index. Since aluminum fluoride ($AlF_3$) has a low refractive index of n=1.45 at a wavelength of 193 nm, the refractive index (n) of the alumina film becomes 1.77 or less when the content of fluoride after forming the sputtering thin film of alumina exceeds 20% by weight. The difference between the refractive index of alumina thus formed and that of the material with a low refractive index—$SiO_2$, $MgF_2$ or $CaF_2$—is so small that it is difficult to obtain excellent optical characteristics.

In the present embodiment, optical parts like lenses and mirrors, on which a thin film of alumina obtained by using the method and system for forming sputtering thin films described above is applied, are used for optical projection systems for effectively producing semiconductor devices.

According to the embodiments of the present invention, a sputtering thin film which is suitable for optical systems used in the ultraviolet and vacuum ultraviolet regions can be produced by appropriately selecting each element of the system and steps for forming a thin film on the substrate, especially by film-forming an alumina ($Al_2O_3$) thin film on the substrate. This film has little absorption in the ultraviolet and vacuum ultraviolet regions and other characteristics required for use described above.

Thin films of alumina formed by the conventional sputtering methods or reactive sputtering methods have unreacted bonds (dangling bonds) due to the bond deficiencies in the film. A high absorption of the film in the ultraviolet and vacuum ultraviolet regions is ascribed to the presence of these deficiencies.

According to the present embodiment, on the other hand, fluorine or gases of fluoride compounds are added by synchronizing with the self-bias control of the target during the process for forming thin films of alumina when unreacted bonds (dangling bonds) due to bond deficiencies are liable to be formed. The process is divided into alternately repeating two steps of mainly forming the films and mainly allowing the gases to react on the surface of the substrate, thereby reducing the density of the bond deficiencies in the film formed, and obtaining thin films with little optical absorption in the ultraviolet region and vacuum ultraviolet region.

The thin films of alumina with low absorption obtained by the embodiments of the present invention have a resistivity against irradiation by a ultraviolet or vacuum ultraviolet lasers like KrF or ArF eximer lasers. Further, the films have high refractive indices when applied on the optical parts to be used in the ultraviolet region (300 nm or below) and vacuum ultraviolet region. When the film is combined with the materials having low refractive indices such as $SiO_2$, $MgF_2$ and $CaF_2$ that are suitable for use in the wavelength region described above, optical elements having low reflective indices in a wide wavelength region can be easily prepared.

Figure 3:
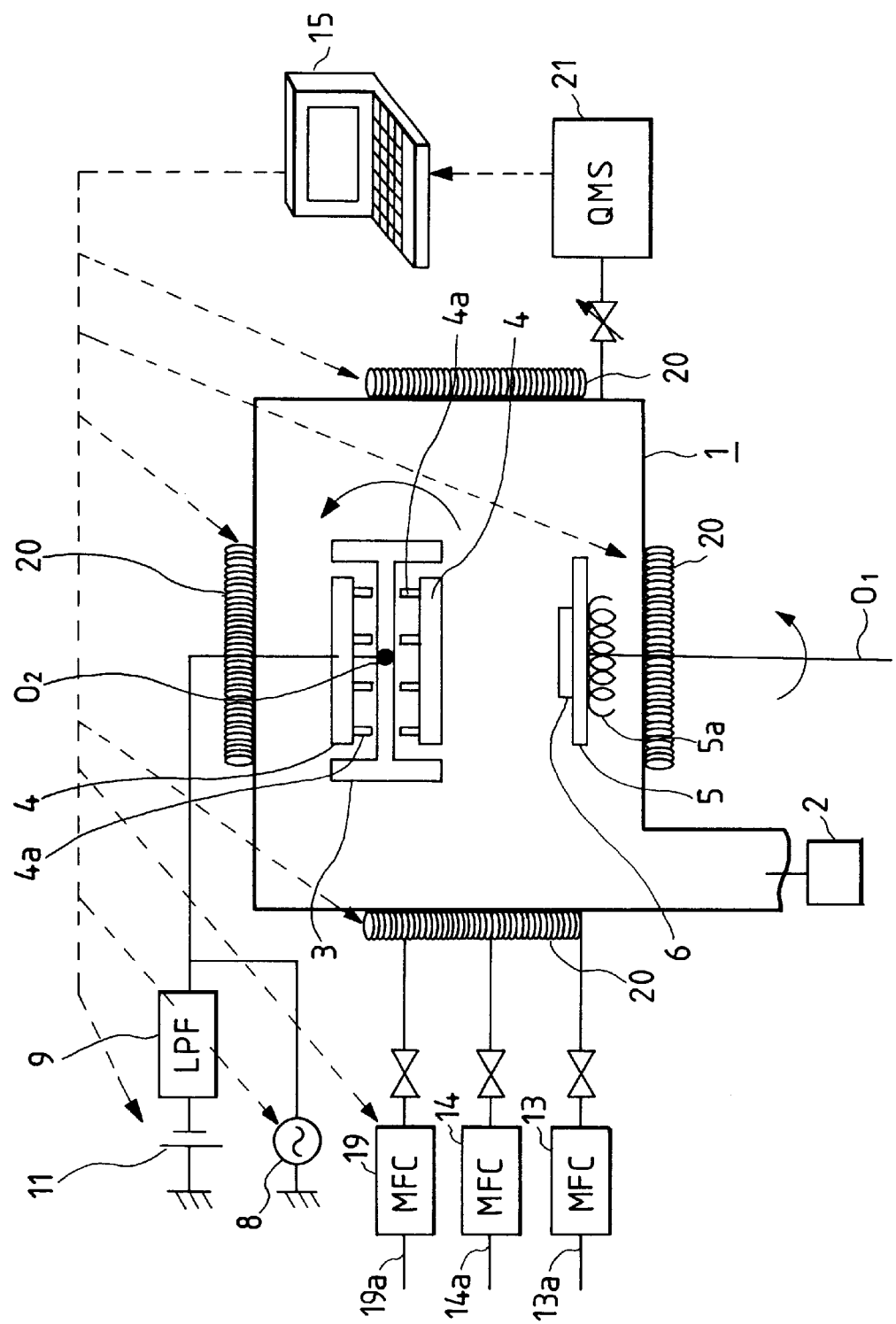
FIG. 3 is a schematic illustration of one example of a thin film forming system used in the present invention equipped with a fluorine monitor.

FIG. 3 shows a system for forming thin films according to the another embodiment of the present invention. This is a system by which the amount of fluorine is monitored during the film-forming process, provided with: a film-forming chamber 1 that is evacuated with a vacuum pump as an evacuation means 2 connected to an exhaust port, a substrate holder 5 as holding means disposed in the chamber, a rotary target unit 3 as generator means for film-forming particles opposed to the substrate holder 5, power sources 8 and 11 for supplying electric current to the target, reaction gas feed means provided with reaction gas feed lines 13a, 14a and 19a for introducing the reaction gases into the film-forming chamber 1 via the mass flow controllers 13, 14 and 19, a mass spectrometer 21 as a detection means for fluorine in the atmosphere of the film-forming chamber 1 and CPU 15 as control means connected to the mass spectrometer. This CPU controls a heater 20 for heating the inside of the film-forming chamber 1, the mass flow controllers 13, 14 and 19 in each reaction gas feed line 13a, 14a and 19a and power sources 8 and 11.

The substrate holder 5 has a heater 5a for heating a substrate 6 as a base body mounted thereon, and rotates around an axis $O_1$ by a rotary driving means (not shown). The rotary target unit 3 has a target holder freely rotating around an axis $O_2$ perpendicular to the axis $O_1$ of the substrate holder 5, and one pair of target 4 held thereon. Both targets 4 are provided with magnets 4a, on their opposed faces. When alternating multi-layers are formed by using two kind of film-forming materials, for example, each target of 4 is used by turns by rotating the target holder 3, thereby making it possible to continuously form each layer without exposing the film-forming chamber 1 to the open air.

The concentration of generated fluorine in the film-forming chamber 1 is detected as fluoride ion current value with the mass spectrometer 21 and the reaction gas feed lines are controlled by sending the signal from the mass spectrometer to CPU.

The amount of fluorine in the film-forming chamber 1 is previously determined by an experiment and the measured values are stored in CPU 15. CPU 15 controls the reaction gas feed lines by comparing the detected values from the mass spectrometer 21 with the stored data in CPU 15.

According to the present embodiment shown in FIG. 3, a thin film having a refractive index identical with the designed values can be constantly formed by adjusting the fluorine levels in the film-forming chamber to a prescribed level. This greatly contributes to the improvement of qualities of the optical thin films and growth of productivity.

In forming conventional thin films to be used in the ultraviolet region, $H_2O$ was introduced in addition to sputtering gases and reaction gases as disclosed in Japanese Patent Application Laid-Open No. 07-070749. Any optical absorption against the KrF laser beam having a wavelength of around 248 nm was not observed in the films. When the same method for forming thin films was applied for the optical parts to be used for the optical systems for ArF eximer laser, the film showed an absorption at a wavelength of 193 nm.

In thin films of light-transmissive oxides commonly used for optical systems, optical absorption becomes more dominant within the thin films as the wavelength becomes shorter; i.e., the ratio of the intensity of the transmitted light against the incident beam intensity—optical transmittance—decreases as the wavelength is decreased. For these reasons, it is supposed that the conventional techniques for forming thin films could not comply with the requirement to reduce the optical absorption when ArF laser having a more shorter wavelength region around 193 nm than that of KrF laser is used.

This optical absorption prevents the transmittance of the film from being increased, which has been the original object according to the present invention. Moreover, the absorbed light energy is transferred within the thin film into heat energy that causes a temperature increase of substrate, or optical glass elements, that results in a functional deterioration of the elements. Therefore, it is desirable to reduce the absorption of the thin film to be as small as possible.

From the view point of micro-structures of the film, bond deficiencies in the film are mainly responsible for the increase in light absorption. The bond deficiencies are related to the presence of atoms in the thin film having unreacted bonds (dangling bonds) that induce optical absorption. Supplying fluorine atoms or hydroxyl groups (OH) to the deficiency sites for allowing them to react with the unreacted bonds is effective for quenching the bond deficiencies.

An object of the examples described hereinafter is, by quenching the unreacted bond, to provide a thin film without any absorption even at a short wavelength region, and a method for forming the same.

The method according to the examples to be described hereinafter comprise a step of introducing at least one of the gases of $CF_4$ and $NF_3$, and $H_2O$ at least simultaneously into the reaction vessel to deposit thin films. In this method, $CF_4$ gas and $NF_3$ gas, and $H_2O$ are decomposed in the plasma forming F (radicals or ions) and OH (radicals or ions), respectively, which react with unreacted bonds in the thin films to quench the bond deficiencies responsible for optical absorptions.

Especially, in the process for forming alumina films, the mass flow rate during the film-formation is adjusted so that the content of fluorine in the thin film becomes 2.0% by weight or more, more preferably 2.0 to 20% by weight, for the purpose of further reducing the optical absorption of the film.

Furthermore, in the process for forming alumina films, the mass flow rate during the film-formation is adjusted so that the content of hydroxyl group in the thin film becomes 0.5% by weight or more for the purpose of further reducing the optical absorption of the film.

Accordingly, when the mass flow rate during the film formation is adjusted so that the contents of fluorine and hydroxyl group in the thin film become 2.0% or more and 0.5% by weight or more, respectively, an alumina film free from optical absorption can be prepared.

The apparatus for forming optical thin films used in the examples below is described referring to FIG. 4.

A substrate holder 5 for holding the substrate 6 and target holder 3 for holding the target 4 are provided in the film-forming chamber 1. The film-forming chamber 1 is connected to a vacuum pump 2 through an exhaust port. An RF voltage having a frequency of 13.56 MHz is impressed on the target 4 from the high frequency power source 8.

101 is a sputtering gas feed means in which valves and mass flow controllers are provided from which Ar or He, or a mixed gas of Ar and He is supplied. Similarly, 102 is an oxygen feed means and 103 and 104 are feed means of the gases containing fluorine atoms. In this figure, 103 provides a feed means for fluorocarbons while 104 provides a feed means for nitrogen fluoride.

105 is a feed means for water, which supplies water vapor evaporated at an isothermal bath 106 into the film-forming chamber 1 through the mass flow controllers and valves.

EXAMPLE 1

The effect of simultaneously introducing $H_2O$ and $CF_4$ will be described in the example of the film forming method by sputtering.

Figure 4:
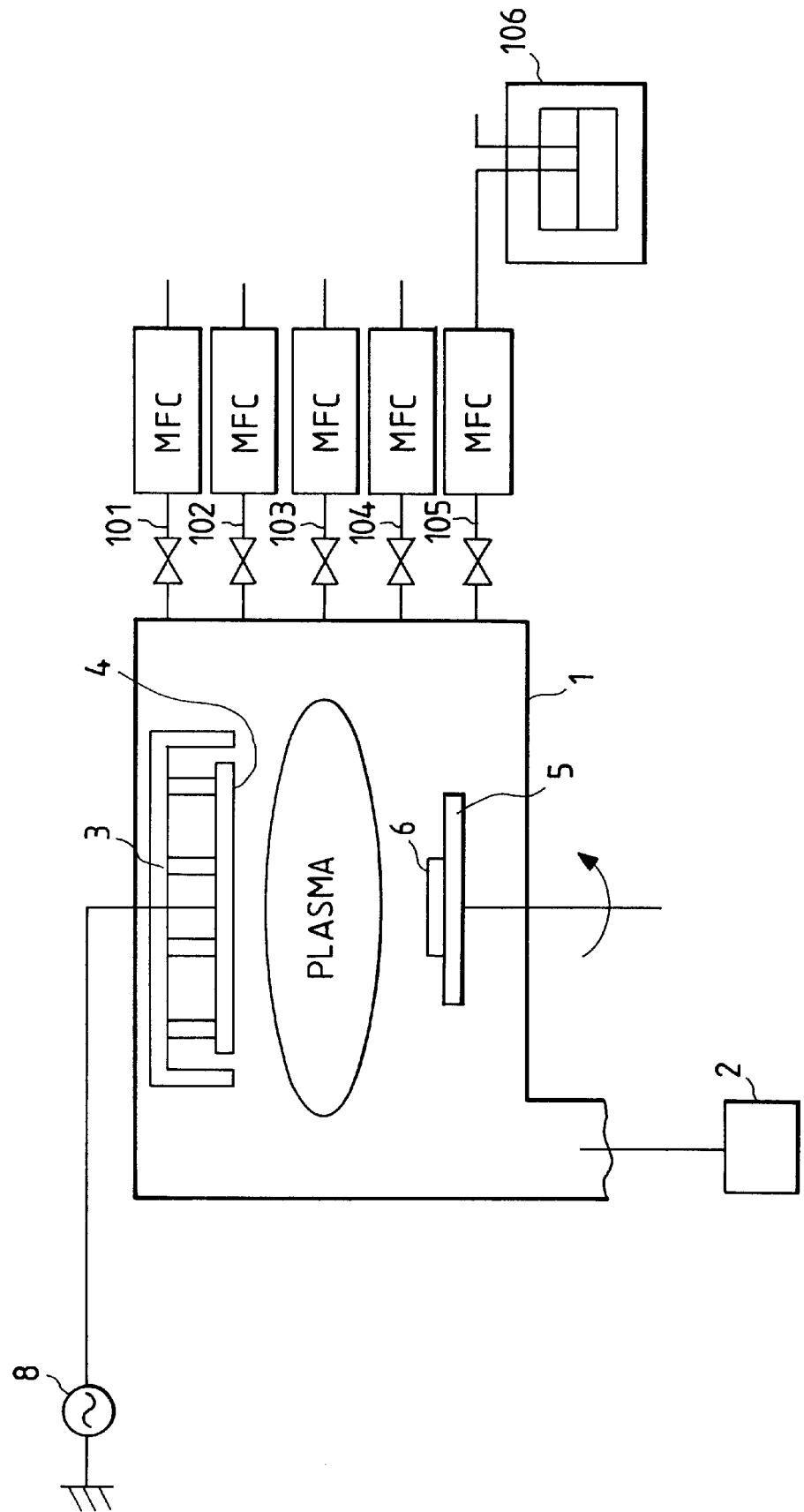
FIG. 4 is a schematic illustration of another example of a thin film forming system used in the present invention.

The system used in this example was that illustrated in FIG. 4. An aluminum target was placed on a holder 3 to which a high frequency electric power can be impressed and on the back face of which a magnet was attached. A substrate 6 on which thin layers were to be laminated was disposed in a vacuum vessel 1. Ar, $O_2$, $CF_4$ and $NF_3$ gases and $H_2O$ vapor were separately introduced into the vessel 1 through each gas feed means. $H_2O$ was introduced after evaporating the liquid to a vapor in an isothermal bath 7.

In this example, $H_2O$ vapor and $CF_4$ gas were introduced in the vacuum vessel at mass flow rates of 2.0 sccm and 3.5 sccm, respectively, while feeding Ar and $O_2$ gases at mass flow rates of 20 sccm and 80 sccm, respectively, thereby depositing an alumina film of about 100 nm in thickness on a quartz substrate.

EXAMPLE 2

$H_2O$ vapor and $CF_4$ gas were introduced in a vacuum vessel at a combined three different mass flow rates while feeding $O_2$ at a mass flow rate of 100 sccm by using the same system as used in Example 1 shown in FIG. 4, thereby depositing an alumina film of about 100 nm in thickness on a quartz substrate followed by measurements of optical absorptivity. The results are shown in Table 1.

The optical absorptivity was calculated as (100%—transmittance—reflectance) where transmittance and reflectance were measured by a spectrophotometer. The measuring wavelength was 193 nm which is the wavelength emitted from ArF laser.

TABLE 1

| | Mass Flow Rate (sccm) | | Optical |
|---|---|---|---|
| | $H_2O$ | $CF_4$ | absorptivity (%) |
| Sample 1 | 0 | 0 | 8.6 |
| Sample 2 | 2.0 | 0 | 2.4 |
| Sample 3 | 2.0 | 3.5 | 0.0 |

By comparing this result with that of Example 1, it was shown that the optical absorptivity was smaller in this example where Ar was not introduced and the alumina film which was formed by introducing both of $H_2O$ vapor and $CF_4$ gas has also smaller optical absorptivity.

EXAMPLE 3

An alumina film was formed by varying the feed mass of $H_2O$ vapor and $CF_4$ gas with a constant mass flow rate of oxygen of 100 sccm by using the same apparatus as used in Example 1 shown in FIG. 4. The relation of the ratio of the hydroxyl group and fluorine contents in the alumina film to the total weight of the film with the optical absorptivity of the film was investigated.

The optical absorptivity was calculated as (100%—transmittance—reflectance) where transmittance and reflectance were measured by a spectrophotometer. The measuring wavelength was 193 nm which is the wavelength emitted from ArF laser. The contents of hydroxyl group and fluorine in the film were determined by ESCA.

When the proportion of hydroxyl group in the film was 0.5% by weight or more, optical absorption was rapidly decreased while, when the proportion of fluorine was 2.0% by weight or more, the optical absorption showed a tendency to be reduced. When the proportions of hydroxyl group and of fluorine were 0.5% by weight or more and 2.0% by weight or more, respectively, an optical absorption of as small as 0.2% or less was realized.

These results indicate that an oxide thin film with a small optical absorption containing both of fluorine and hydroxyl group can be formed by at least simultaneously introducing at least one of the gases of $CF_4$ and $NF_3$, and $H_2O$ vapor.

EXAMPLE 4

The gases of $CF_4$ and $NF_3$ introduced have an effect for reducing the optical absorption of the film because F atoms generated by a decomposition of these gases in a plasma during sputtering react with unreacted bonds (dangling bonds) at the sites of bond deficiencies in the thin film. It is sometimes observed, however, that an excess amount of F atoms incorporated into the thin film also reduces the refractive index of the film.

Although the changes in refractive indices should not always be noticed, a design of the optical films for realizing desired optical characteristics would be difficult when the refractive index of the film has been reduced. Despite a reduction of the contents of $CF_4$ and $NF_3$ in the film being desirable in one viewpoint, an excessive reduction would make it impossible to decrease the optical absorption.

The examples to be described hereinafter is to provide thin films that do not have any absorption and have a high refractive index in the ultraviolet region.

Thin films were allowed to deposit by introducing oxygen, $H_2O$ vapor, at least one of the gases of $CF_4$ and $NF_3$, and He in the vacuum vessel when the films were formed by the sputtering method according to the examples described hereinafter.

The effect of introducing He is that helium atoms are excited in the plasma and are converted to metastable atoms followed by generating activated oxygen by reacting with oxygen molecule, thereby curing insufficient oxidation of the film to decrease the optical absorption. On the other hand, no reduction in the refractive index is observed compared with the cases when $CF_4$ and $NF_3$ gases are introduced without introducing He gas. However, since the problem of reducing the optical absorption in the ultraviolet region can not be fully settled only by introducing $O_2$, $H_2O$ and He, introduction of $CF_4$ and $NF_3$ gases together with the above gases should be considered.

After all, in order not to lower the refractive index of the film without increasing the optical absorption of the thin film, it is more preferable that the amount of the three kind of gases of $O_2$, $H_2O$ and He introduced is at first optimized so that the optical absorption is minimized. Then optimizing the amount of $CF_4$ and $NF_3$ gases, introduced again to minimize the optical absorption of the film.

Further decrease in the optical absorption of the film is made possible when the mass flow rates of the gases during the formation of aluminum oxide films are adjusted so that 0.5% by weight or more of hydroxyl group and 2.0% by weight or more of fluorine are contained in the thin film.

The system illustrated in FIG. 4 was again used in this Example 4. Sputtering was carried out by introducing He, $O_2$, $CF_4$ and $H_2O$ in the vacuum vessel in which an aluminum target was placed on the target holder 3.

Oxygen was fed at a mass flow rate of 100 sccm while $H_2O$, He and $NF_3$ gases were introduced at each combination of mass flow rates as listed in Table 2 in the vacuum vessel. A film of $Al_2O_3$ with a thickness of 100 nm was deposited in each experiment by impressing 500 W of high frequency power on the target. The results of measurements of optical absorptions and refractive indices are also shown in Table 2.

The optical absorptivity was calculated as (100%—transmittance—reflectance) where transmittance and reflectance were measured by a spectrophotometer. The measuring wavelength was 248 nm and 193 nm which are the wavelength emitted from KrF and ArF lasers, respectively. The refractive index was measured at 193 nm which is the wavelength emitted from ArF laser.

TABLE 2

| | Mass flow rate (sccm) | | | Optical absorptivity (%) | | Refractive index |
|---|---|---|---|---|---|---|
| | $H_2O$ | He | $CF_4$ | 248 (nm) | 193 (nm) | |
| Sample 4 | 2.0 | 0 | 0 | 0.3 | 2.5 | 1.83 |
| Sample 5 | 2.0 | 0 | 1.5 | 0.0 | 0.0 | 1.76 |
| Sample 6 | 2.0 | 250 | 0 | 0.0 | 1.5 | 1.82 |
| Sample 7 | 2.0 | 250 | 0.7 | 0.0 | 0.0 | 1.81 |

By comparing Sample 4 with Sample 6, it is shown that, when He was introduced, the optical absorption of Sample 6 was reduced but not fully extinguished although little reduction in the refractive index was observed. In Sample 5, the optical absorption was reduced to 0% by introducing a large amount of $CF_4$, but the refractive index was also considerably reduced. When the mass flow rate of $CF_4$ was adjusted while keeping the mass flow rates of $H_2O$ and He in Sample 6 constant so that the optical absorption becomes 0%, a film of Sample 7 in which the refractive index was not so greatly reduced as compared with that of Sample 4 was obtained.

The results above indicate that Sample 7 formed by optimizing the mass flow rates of $H_2O$, He and $CF_4$ gives a film having a high refractive index without any optical absorption at 248 nm and 193 nm.

EXAMPLE 5

Figure 5:
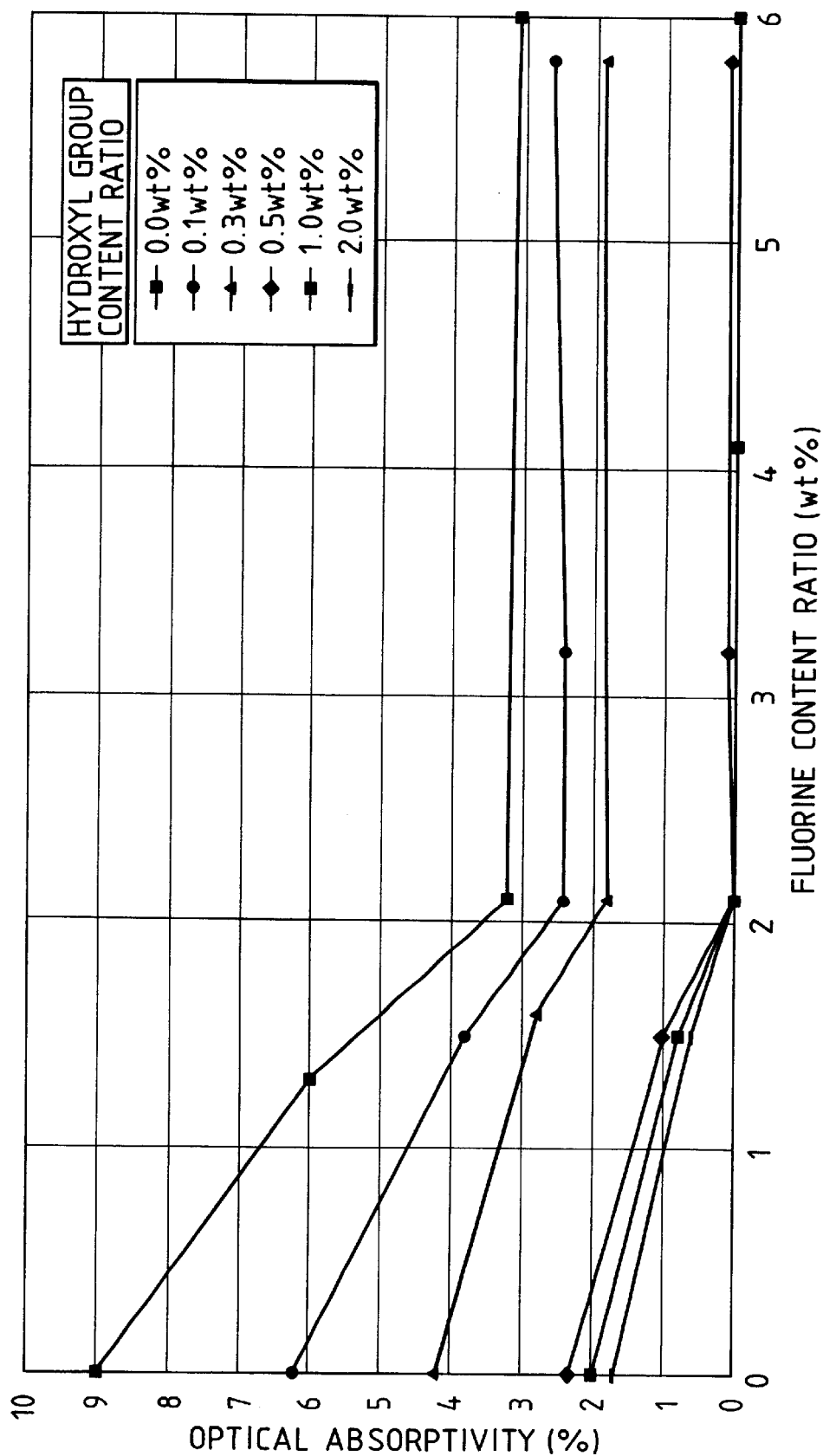
FIG. 5 is a graph indicating the relation of the contents of fluorine and hydroxyl groups in alumina with the optical absorptivity.

A film of $Al_2O_3$ was formed by keeping a mass flow rate of $O_2$ at 100 sccm with changing the mass flow rates of $H_2O$ and $CF_4$ by using the same apparatus as was used in Example 1. The relation between the weight ratio of hydroxyl group and fluorine to the total weight of the film and the optical absorptivity is shown in FIG. 5.

The optical absorptivity was calculated as (100%—transmittance—reflectance) where transmittance and reflectance were measured by a spectrophotometer. The measuring wavelength was 193 nm which is the wavelength emitted from ArF laser. The contents of hydroxyl group and fluorine in the $Al_2O_3$ film were measured by ESCA.

The figure shows that the optical absorption rapidly decreases when the contents of hydroxyl group and fluorine are 0.5% by weight or more and 2.0% by weight or more, respectively. The content of fluorine was never increased up to 6.0% by weight or more even when its mass flow rate was increased. Therefore, it was made clear that an optical absorption as small as 0.1% or less can be realized in a range that the contents of hydroxyl group is 0.5% by weight or more and that of fluorine is 2.0% by weight or more.

This example indicates that an oxide film with little optical absorption and high refractive index can be formed by introducing at least one of fluorine-containing gases such as the $CF_4$ gas or $NF_3$ gas together with $H_2O$ and He when the thin film is formed by a sputtering method.

EXAMPLE 6

A stoichiometric ratio of Al:O=2:3 has been recognized to be optimal for reducing the optical absorption when optical thin films of $Al_2O_3$ for uses in the ultraviolet wavelength region are formed.

However, in the $Al_2O_3$ films formed based on the above technical concept, the optical absorption was not reduced at a wavelength of ArF eximer laser (193 nm).

Therefore, gases containing H compounds and F compounds and He in addition to conventional gases containing $O_2$ were introduced into the vacuum vessel of the sputtering system for the purpose of solving the problems described above in forming optical thin films of $Al_2O_3$. The binding ratio of Al to O in the thin film formed by this method is not 2:3 but O is excessively bound to Al. The film also contains OH groups that are recognized to terminate excess bonds. This is the condition for reducing the optical absorption and for providing a thin film having a low optical absorption at a wavelength of ArF eximer laser (193 nm).

In this example, sample 8 was prepared by using the system shown in FIG. 4.

Al and quartz were used as a target and substrate, respectively, and a RF power source was used. The method for forming optical thin films according to the present example is as follows:

The inside of the vacuum chamber was first evacuated to $1\times10^{-4}$ Pa or less. Then, $O_2$ gas, He gas and $H_2O$ gas were introduced at mass flow rates of about 100 sccm, 100 sccm and 2 sccm, respectively. An electric power from the power source was supplied to the target to generate a plasma. The target component Al was sputtered by this plasma and reacted with oxygen to form a thin film of aluminum oxide. The atomic ratio of Al and O in the film of aluminum oxide formed by this method was confirmed to be 1:1.7 by an assay using ESCA. The proportion of oxygen that was bound to Al to the total oxygen in the film was 96.4% while the proportion of oxygen incorporated into OH bonds was 3.6%. The optical absorptivity of the film formed by this method at a wavelength of ArF eximer laser (193 nm) was only 0.6% per 100 nm of film thickness.

Sample 9 was prepared as follows:

Al and quartz were used as a target and substrate, respectively, and a RF power source was used.

The inside of the vacuum chamber was first evacuated to $1\times10^{-4}$ Pa or less. Then, $O_2$ gas, He gas and $H_2O$ gas were introduced at mass flow rates of about 100 sccm, 200 sccm and 2 sccm, respectively. An electric power from the power source was supplied to the target to generate a plasma. The target component Al was sputtered by this plasma and reacted with oxygen to form a thin film of aluminum oxide. The atomic ratio of Al and O in the film formed by this method was confirmed to be 1:1.71 by an assay using ESCA. The proportion of oxygen that is bound to Al to the total oxygen in the film was 96.9% while the proportion of oxygen incorporated into OH bonds was 3.1%.

The optical absorptivity of the film formed by this method at a wavelength of ArF eximer laser (193 nm) was only 0.3% per 100 nm of film thickness.

Sample 10 was prepared as follows:

Al and quartz were used as a target and substrate, respectively, and a RF power source was used.

The inside of the vacuum chamber was first evacuated to $1\times10^{-4}$ Pa or less. Then, $O_2$ gas, $CF_4$ gas and $H_2O$ gas were introduced at mass flow rates of about 100 sccm, 3.5 sccm and 2 sccm, respectively. An electric power from the power source was supplied to the target to generate a plasma. The target component Al was sputtered by this plasma and reacted with oxygen to form a thin film of aluminum oxide.

The atomic ratio of Al, O and F in the aluminum oxide film formed by this method was confirmed to be 1:1.59:0.21 by an assay using ESCA. The proportion of oxygen that was bound to Al to the total oxygen in the film was 97.3% while the proportion of oxygen incorporated into OH bonds was 2.7%. F in the film was not bound to Al.

The optical absorptivity of the film formed by this method at a wavelength of ArF eximer laser (193 nm) was only 0.1% per 100 nm of film thickness.

Sample 11 was prepared as follows:

Al and quartz were used as a target and substrate, respectively, and a RF power source was used.

The inside of the vacuum chamber was first evacuated to $1 \times 10^{-4}$ Pa or less. Then, $O_2$ gas, He gas and $H_2$ gas were introduced at mass flow rates of about 180 sccm, 200 sccm and 30 sccm, respectively. An electric power from the power source was supplied to the target to generate a plasma. The target component Al was spattered by this plasma and reacted with oxygen to form a thin film of aluminum oxide. The atomic ratio of Al and O in the film formed by this method was confirmed to be 1:1.65 by an assay using ESCA. The proportion of oxygen that was bound to Al to the total oxygen in the film was 97% while the proportion of oxygen incorporated into OH bonds was 3%.

The optical absorptivity of the film formed by this method at a wavelength of ArF eximer laser (193 nm) was only 0.3% per 100 nm of film thickness.

The results obtained in Example 6 described above are listed in Table 3. The example allowed formation of an optical thin film mainly containing $Al_2O_3$ having an optical absorptivity of 1% or less at a wavelength of ArF eximer laser (193 nm) at a low temperature.

TABLE 3

| | Content of O (ratio to Al) | Ratio of O bound to Al (%) | Ratio of O bound to OH (%) | Content of F (ratio to Al) |
|---|---|---|---|---|
| Sample 8 | 1.70 | 96.4 | 3.6 | 0.0 |
| Sample 9 | 1.71 | 96.9 | 3.1 | 0.0 |
| Sample 10 | 1.59 | 97.3 | 2.7 | 0.21 |
| Sample 11 | 1.65 | 97.0 | 3.0 | 0.0 |

As described in the examples above, when the ratio of NE to NA, where the number of aluminum atoms is NA and that of atoms other than Al is NE, is more than 1.55 and less than 1.85, the thin films exhibit excellent optical characteristics.

It is desirable that the ratio of NO to NA, where NO is the number of oxygen atoms, is more than 1.55 and less than 1.75.

It is further preferable that the proportion of the number of oxygen atoms bound to aluminum atoms is 95% or more and that of the number of oxygen atoms bound to hydrogen atoms is 2.0% or more.

What is claimed is:

1. A method for forming a reflection preventing film for vacuum ultraviolet light, comprising the steps of:
    disposing a target containing aluminum in a vessel;
    introducing fluorine or fluorine compounds;
    introducing $O_2$;
    introducing $H_2O$; and
    sputtering the target to form an aluminum oxide film comprising fluorine,
    wherein the content of the fluorine in the film is 2.0 wt % to 20 wt % and the content of hydroxyl group in the film is 0.5 wt % or more, whereby an optical absorption of the aluminum oxide film in a vacuum ultraviolet light region is lowered.

2. The method according to claim 1 wherein fluorine or fluorine compounds are selected from the group consisting of $F_2$, $NF_3$, $SiF_4$, $CF_4$, $C_2F_2$ and $C_4F_8$.

3. The method according to claim 1 wherein helium is introduced into the vessel with the fluorine, fluorine compounds, $O_2$ and $H_2O$.

4. The method according to claim 1 wherein at least one of the gases of $CF_4$ or $NF_3$, and He is introduced.

5. The method according to claim 1 wherein the reflection preventing film is formed while monitoring the content of fluorine atoms in the vessel.

6. The method according to claim 1 wherein the reflection preventing film is formed in a light-transmissive insulating substrate.

7. The method according to claim 6 wherein the light-transmissive insulating substrate is quartz or fluorite.

8. A method for forming a reflection preventing film for vacuum ultraviolet light, comprising the steps of:
    disposing a target containing aluminum in a vessel;
    introducing fluorine or fluorine compounds;
    introducing $O_2$;
    introducing $H_2O$; and
    sputtering the target by applying a high frequency voltage and DC voltage thereto, to form an aluminum oxide film comprising fluorine,
    wherein the content of the fluorine in the film is 2.0 wt % to 20 wt % and the content of hydroxyl group in the film is 0.5 wt % or more, whereby an optical absorption of the aluminum oxide film in a vacuum ultraviolet light region is lowered.

9. The method according to claim 8 wherein argon is introduced.

10. The method according to claim 8 wherein the fluorine or fluorine compounds are one or a plurality of compounds selected from $F_2$, $NF_3$, $SiF_4$, $CF_4$, $C_2F_2$, or $C_4F_8$.

11. A method for forming a reflection preventing film for vacuum ultraviolet light in which a plasma is generated by applying a high frequency voltage to a cathode electrode in a vacuum vessel, ions in the plasma are accelerated and collided to a target to make aluminum or alumina to be ejected from the target and a thin film of alumina is formed on the substrate, comprising forming the thin film or alumina by adding a gas containing fluorine or a gas containing fluoride compounds, $O_2$ and $H_2O$ into a sputtering gas,
    wherein the content of the fluorine in the film is 2.0 wt % to 20 wt % and the content of hydroxyl group in the film is 0.5 wt % or more
    wherein a means in which a repeating self-bias with a repeating frequency, which is temporarily set near ground potential during sputtering discharge is used so that sputtering is diminished though plasma continues to be generated, and the gas supplemented with fluorine or fluoride compounds is introduced by synchronizing with the self-bias near ground potential.

12. The method for forming a reflection preventing film for vacuum ultraviolet light according to claim 11 wherein means in which the self-bias potential is set near the ground potential during sputtering discharge is used and the repeating frequency is 0.1 Hz or less.

13. A method for forming a film containing a metal, oxygen and fluorine, comprising the steps of:
    disposing a target on a cathode electrode in a vessel;
    introducing $O_2$ in the vessel;

applying a high frequency voltage capable of forming a plasma to the cathode electrode in the vessel;

periodically applying DC voltage capable of reducing ion acceleration to the cathode electrode; and periodically introducing fluorine or fluorine compounds by synchronizing with the DC voltage application.

14. The method according to claim 13, wherein an application cycle of the DC voltage is 0.1 Hz or less.

15. A method for forming a reflection preventing film for vacuum ultraviolet light, comprising the steps of:

disposing a target containing aluminum in a vessel;

introducing fluorine or fluorine compounds;

introducing $O_2$;

introducing $H_2O$; and sputtering the target to form an aluminum oxide film comprising fluorine and hydrogen, whereby an optical absorption of the film in a vacuum ultraviolet light region is lowered.

* * * * *

UNITED STATES PATENT AND TRADEMARK OFFICE
CERTIFICATE OF CORRECTION

PATENT NO. : 6,383,346 B2
DATED : May 7, 2002
INVENTOR(S) : Kenji Ando et al.

It is certified that error appears in the above-identified patent and that said Letters Patent is hereby corrected as shown below:

Title page,
Item [56], References Cited, FOREIGN PATENT DOCUMENTS,
"770749        should read    -- 7-70749
7258841                                7-258841
7258845                                7-258845 --.

Column 1,
Line 10, "have a" should read -- have --;
Line 17, "kind" should read -- kinds --;
Line 19, "The" should be deleted; and
Line 66, "satisfy" should read -- to satisfy --.

Column 2,
Line 13, "lenses" should read -- lens --;
Line 32, "eximer" should read -- excimer --;
Line 37, "a good" should read -- good --;
Line 40, "An another" should read -- Another --;
Line 46, "is" should be deleted; and
Line 48, "Still" should read -- Still a --

Column 3,
Line 51, "earth" should read -- ground --.

Column 4,
Line 2, "gasses" should read -- gases --;
Line 27, "generates" should read -- generate --; and
Line 32, "completed," should read -- been completed, --.

Column 5,
Line 31, "atom" should read -- atoms --; and
Line 34, "atom" should read -- atoms --; and "low" should read -- lower --.

Column 6,
Line 52, "by a" should read -- by --;
Line 53, "eximer" should read -- excimer --; and
Line 64, "the" (first occurrence) should be deleted.

UNITED STATES PATENT AND TRADEMARK OFFICE
CERTIFICATE OF CORRECTION

PATENT NO. : 6,383,346 B2
DATED : May 7, 2002
INVENTOR(S) : Kenji Ando et al.

It is certified that error appears in the above-identified patent and that said Letters Patent is hereby corrected as shown below:

Column 7,
Line 24, "Kind" should read -- kinds --;
Line 52, "eximer" should read -- excimer --; and
Line 63, "more" should be deleted.

Column 8,
Line 6, "view point" should read -- viewpoint --.

Column 10,
Line 40, "can not" should read -- cannot --; and
Line 47, "minimized. Then" should read -- minimized, then --.

Column 12,
Lines 5, 16, 37 and 55, "eximer" should read -- excimer --.

Column 13,
Lines 8, 27 and 32, "eximer" should read -- excimer --; and
Line 18, "spattered" should read -- sputtered --.

Column 14,
Line 45, "film or" should read -- film of --; and
Line 50, "more" should read -- more, --.

Signed and Sealed this

Nineteenth Day of November, 2002

Attest:

JAMES E. ROGAN
*Attesting Officer*  *Director of the United States Patent and Trademark Office*